United States Patent [19]

Kawakami et al.

[11] Patent Number: 5,185,186
[45] Date of Patent: Feb. 9, 1993

[54] MASK FOR PLATE MAKING
[75] Inventors: Sota Kawakami, Shiroyama; Miyuki Hosoi, Hachioji, both of Japan
[73] Assignee: Konica Corporation, Tokyo, Japan
[21] Appl. No.: 744,105
[22] Filed: Aug. 13, 1991
[30] Foreign Application Priority Data
Aug. 17, 1990 [JP] Japan .................. 2-216637
[51] Int. Cl.$^5$ .............................................. B05D 3/04
[52] U.S. Cl. ...................................... 427/332; 427/337
[58] Field of Search ................................ 427/332, 337
[56] References Cited
U.S. PATENT DOCUMENTS
4,816,382 3/1989 Kaneko .............................. 430/320

Primary Examiner—Bernard Pianalto
Attorney, Agent, or Firm—Finnegan, Henderson, Farabow, Garrett and Dunner

[57] ABSTRACT

A method for preparing a mask for plate-making is disclosed. The method comprises the steps of contacting an ink layer receiving material with an ink layer transfer material having an ink layer on a substrate, applying heat in a mask pattern to the contacted material, and transferring the ink layer to the ink layer receiving material. The transmission density of the ink layer is not lower than 2 for light having a wavelength not longer than 500 nm and is not higher than 2 for at least a part of light having a wavelength longer than 500 nm.

6 Claims, 7 Drawing Sheets

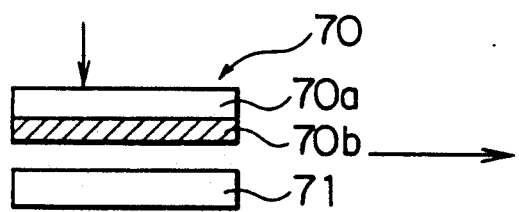 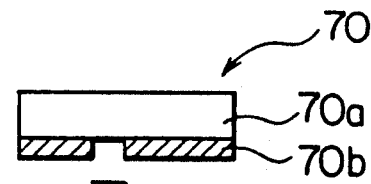
FIG. 4(a)  FIG. 4(b)
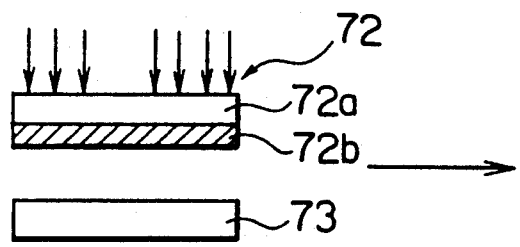 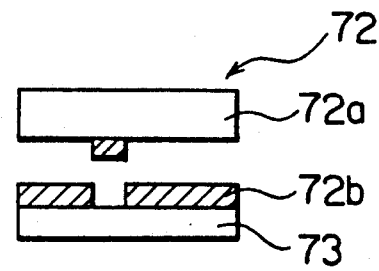
FIG. 5(a)  FIG. 5(b)
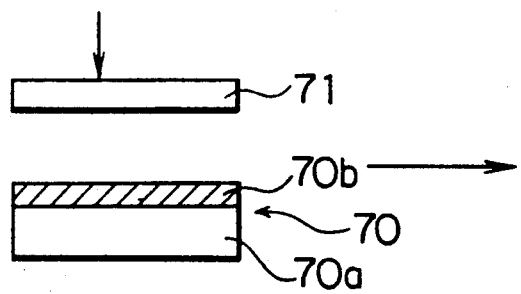 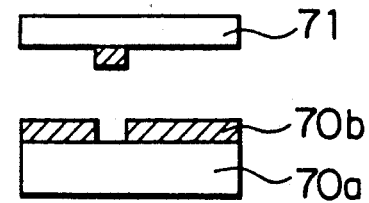
FIG. 6(a)  FIG. 6(b)
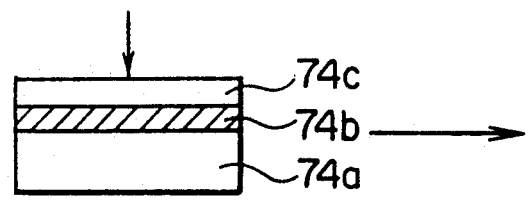 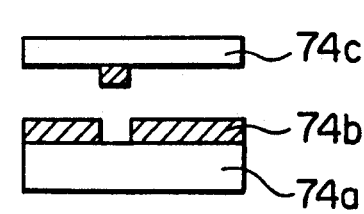
FIG. 7(a)  FIG. 7(b)

MASK FOR PLATE MAKING

FIELD OF THE INVENTION

This invention relates to a process for preparing a mask for plate making and to the materials therefor.

BACKGROUND OF THE INVENTION

In the printing and plate making fields, for example, the so-called combination montage techniques including those for making the montages of pictures themselves, pictures and letters, or pictures and marks are so used as to put catalogues, pamphlets and circulars into print.

The combination montages of this kind are carried out, for example, in the following manner. The pieces of some originals clipped in advance are put on a transparent base and a read-only original is prepared. From the read-only original, a negative and a plate-making mask are prepared. Thus, a clipped portion corresponding to a character original, for example, can be formed on the resulting plate-making mask. In this case, a negative of the character original can be obtained by taking the photograph of the character original. The resulting character original negative, read only original negative and the plate-making mask are each put one upon another and are then exposed to light and developed, so that a positive original can be obtained. The resulting positive original is printed on a presensitized printing plate, so that a printing plate is obtained. A printing is carried out by making use of the resulting printing plate, so that a series of the objective pamphlets or circulars are printed.

In the plate-making process for preparing a printing plate by making use of the plate-making block copy, there are the methods for preparing a plate-making mask including, for example, such a method as disclosed in Japanese Patent Publication Open to Public Inspection (hereinafter referred to as 'Japanese Patent O.P.I. Publication') No. 63-38941/1988, in which the following procedures are carried out. A mask forming film comprising a support having thereon a pealable mask forming layer is placed on a plate-making block copy; the plate-making block copy is observed through the mask forming film; a slitting kerf is provided onto the portion of the mask-forming layer corespondent to the designated portion of the plate-making block copy; and the portion enclosed by the slitting kerf is separated by pealing it away from the other portions.

The methods for automatically preparing such a slitted mask as described above include, for example, a method such as described in Japanese Utility Model O.P.I. Publication No. 61-157947/1986, in which the following procedures are carried out; the image of an original block is enlarged and projected onto a digitizer; the data of the contours of the enlarged and projected image are obtained by tracing the image contours by making use of a cursor or the like; and the mask-forming film is cut by making use of an XY cutter while keeping it controlled according to the contour data.

An attempt for automating the processes in which a mask for plate-making is prepared by slitting a mask-forming film is described in Japanese Patent O.P.I. Publication No. 2-959/1990. In this technique, however, it is troublesome to remove the slitted portions, because the slitted portions should be removed by hand.

When catalogues, pamphlets and circulars are prepared in color printing and plate making, 3 pieces of plate-making masks are required for color separation and, when the respective plate-making masks are prepared by slitting the mask-forming film, there raise the problems that the removals of the slitted portions of the plate-making masks are liable to be confoundingly forgotten.

It is an object of the invention is to solve the abovedescribed problems and, therefore, to provide a process for preparing a mask for plate-making in which the mask for plate-making can quite readily be obtained by utilizing a thermal transfer technique, and the materials for the mask for plate-making.

SUMMARY OF THE INVENTION

The objects of the invention can be achieved with the following process and materials;

the process for preparing a mask for plate-making which comprises the steps of thermally transferring an ink layer heated mask-patternwise from an ink layer transfer material comprising a substrate and provided thereon an ink layer in advance over to an ink layer receiving material, and serving either the ink layer transfer material having the mask-pattern or the ink layer receiving material as a mask for plate-making in a plate-making process for preparing a printing plate from a plate-making block copy;

the material described above for the mask for plate-making, wherein the transmission density of the ink layer is not lower than 2 for light having a wavelength at least not longer than 500 nm and also not higher than 2 for at least a part of light having a wavelength longer than 500 nm;

the ink layer transfer material described above for the mask, wherein a center line average roughness of the surface of the ink layer or the surface of a substrate opposite to the ink layer is within the range of 0.1 to 2.0 $\mu$m; and the material for the mask, wherein, on either one side or the both sides of the surface of the ink layer and the surface of the substrate not facing the ink layer, the surface resistibility thereof is not higher than $10^{12}\Omega$ under the atmospheric conditions of 25° C. and 25% RH.

BRIEF DESCRIPTION OF THE DRAWINGS

FIGS. 4, 5, 6 and 7 each illustrate the examples of preparing the masks for plate-making; wherein referential number 1 is an image processing section; 2 is an image memory; 3 is an image inputting section; 5 is a print-controller; 6 is a thermal transfer system; 70 and 72 are each thermal transfer ink ribbons; and 71 and 73 are each image recipient member.

DETAILED DESCRIPTION OF THE INVENTION

Figure 1A:
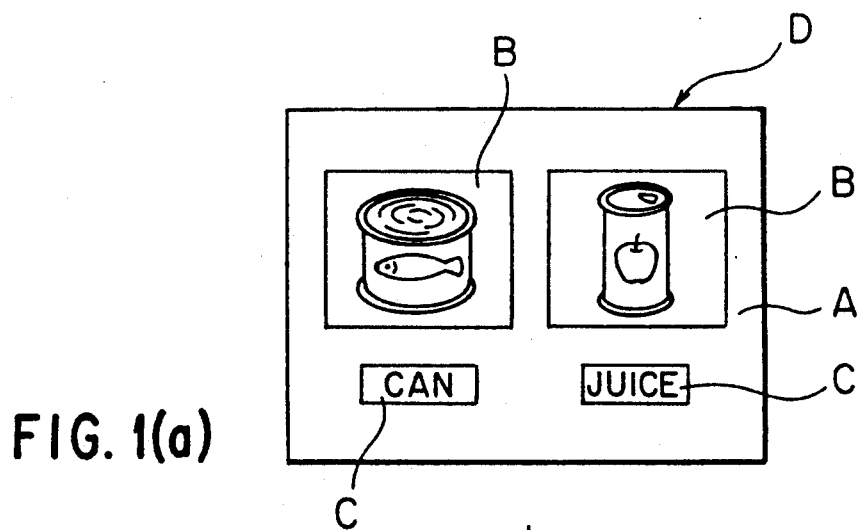
FIGS. 1(a), 1b and 1(c) each illustrate the examples of the processes of preparing the above-mentioned mask for plate-making and the examples of the application of the mask for plate-making.

This invention relates to a process for preparing a mask for plate-making which is comprised of the steps of thermally transferring an ink layer heated mask-patternwise from an ink layer transfer material comprising a substrate and provided thereon an ink layer in advance to an ink layer receiving material, and serving either the ink layer transfer material having the mask pattern or the ink layer receiving material.

The heat applied mask-patternwise means either heat applied to a portion where light should be shielded or heat applied to a portion where light should be transmitted. The methods for applying heat mask-patternwise include, for example, the methods in which heat is applied by making use of a heating roller or a thermal head, or heat is generated by a light irradiation. It is desirable to apply the abovementioned mask pattern to a masking material for plate-making in the following manner; an image is read from an original prepared in advance by means of a scanner, digitizer or video camera; a portion required to be masked is judged by making use of a computer; the resulting judgement is output in the form of a digital signal; the portion corresponding to the output is converted into light or heat; and the resulting light or heat is applied to a masking material for plate-making.

The preparation of the mask pattern shall not be limited to the above-described methods, but it is allowed to prepare it, for example, by making use of a freehand hot-pen.

When obtaining a mask pattern in the form of a digital pattern such as a computer output, the heat application is preferably made by a thermal head capable of readily digitalize the pattern or by a laser beam irradiation.

Both for ink layer transfer materials and ink layer receiving materials, the substrate applicable to the abovedescribed plate-making mask includes, for example, a macromolecular film made of polyester, polycarbonate, acryl, polystyrene or polyethylene; paper such as condenser paper; glass; metal; or composite materials such as a metal-evaporated film.

It is also allowed to use any ink layers, provided that they can be transferred by applying heat thereto. It is further allowed that the ink layers may have a multilayered structure so that they can be thermally transferred efficiently by applying heat thereto. For example, a substrate may be multilayered thereon with the following layers in the following order; (1) a pealable layer and a colorant layer; (2) a pealable layer, a colorant layer and an adhesive layer; and (3) a colorant layer and an adhesive layer; provided, the constitution of the ink layers shall not be limited thereto.

The above-mentioned mask-patterned heating may be applied to the surface of the substrate not facing an ink layer of an ink layer transfer material or an ink layer receiving material.

In the masking materials of the invention, the ink layer has a transmission density capable of effectively shielding a masking portion from light when substantially making an exposure in the courses of plate-making, and it is desirable that the transmission density is not lower than 2 for light having a wavelength at least not longer than 500 nm and not higher than 2 to at least a part of light having a wavelength longer than 500 nm. When a masking material for plate-making has a density within the above-given range, it is possible to cut the rays of light effectively in the course of plate-making and, at the same time, to observe an image appeared underneath the mask, so that the plate-making can efficiently be performed.

The means for obtaining the above-mentioned transmission property include, for example, a means in which a yellow or red dye pigment is contained in an ink layer. The dye pigments applicable thereto include, for example, fast yellow G, benzidine-yellow, pigment-yellow, indofast orange, irgadine-red, paranitroaniline-red, toluidine-red, oigment orange R, resol red 2G, lake red O, oil yellow GG, zapon fast yellow CGG, sumiplast yellow GG, zapon fast orange GG, oil scarlet, sumiplast orange G, zapon fast scarlet OC, and aisen spilon red BEH.

The ink layer is also allowed to contain, besides the colorants, a wax, a thermoplastic resin, and a variety of additives, for example.

The wax applicable thereto include, for example, carnauba wax, montan wax, beeswax, rice wax, paraffin wax, microcrystalline wax, polyethylene wax and sasol wax.

The thermoplastic resins include, for example, a polyamide resin, a polyester resin, a polyacrylic acid ester type resin such as polymethyl methacrylate and polyethyl acrylate, a polyurethane resin, a polyvinyl chloride resin, a polyvinylidene chloride resin, a polystyrene resin, a polyvinyl acetate resin, a polyethylene resin, a polypropylene resin, a polybutadiene resin, a polyvinyl alcohol resin, a phenol resin, a cellulose type resin such as methyl cellulose, ethyl cellulose, carboxymethyl cellulose and nitrocellulose, a polyvinyl ether resin, a polyvinyl pyrrolidone resin, a petroleum type resin, a rosin type resin, a chroman indene resin, a terpene type resin, a styrene butadiene rubber, and isoprene rubber. They may be used independently or in combination.

Further, the additives include, for example, an antistatic agent, a variety of surface active agents, a higher apliphatic acid, a long-chained alcohol, metal salts of a long-chained aliphatic acid, an antioxidant, a variety of plasticizers, and silicone oil.

The antistatic agents applicable to the invention include, for example; nonionic antistatic agents such as polyoxyethylene alkyl ether, polyoxyethylene alkyl phenol, polyoxyethylene alkyl amine, polyoxyethylene alkyl amide, fatty acid polyethylene glycol, fatty acid sorbitane esters, polyoxyethylene fatty acid sorbitane esters, fatty acid glycerol esters and alkylpolyethylene imine; anionic antistatic agents such as fatty acid amine salts, alkyl phosphoric acid salts, polyoxyethylenealkyl phosphoric acid ester, alkyl sulfuric acid esters and polyoxyethylenealkyl sulfuric acid esters; cationic antistatic agents such as alkylamine salts, alkyl quaternary ammonium salts and alkylimidazoline derivatives and polyamine ethylene oxide adducts; and amphoteric antistatic agents such as those of the alkyl betaine type, alkyl imizoline derivatives, those of the N-alkyl β alanine type and alkyldiamine derivatives.

Besides the above, a small amount of carbon black and/or a water-soluble conductive polymer may also be contained in an ink layer or a backing layer on the surface of a substrate opposite to the ink layer. The water-soluble conductive polymers include, for example, a polymer containing at least one conductive group selected from the group consisting of a sulfonic acid group, a sulfuric acid ester group, a quaternary ammonium salt, a tertiary ammonium salt, a carboxyl group, and a polyethylene oxide group. Among the above-given groups, a sulfonic acid group, a sulfuric acid ester group, and a quaternary ammonium salt may preferably be used. The conductive groups are required to be contained therein in a proportion of not less than 5 wt % per molecule of the water-soluble conductive polymer. Further, the water-soluble, conductive polymers each contain a carboxyl group, a hydroxy group, an amino group, an epoxy group, an aziridine group, an active methylene group, a sulfinic acid group, an aldehyde group, and a vinylsulfone group. Among the above-given groups, a carboxyl group, a hydroxy group, an amino group, an epoxy group, an aziridine group, and an aldehyde group may preferably be contained therein. These groups are each required to be contained therein in a proportion of not less than 5 wt % per molecule of the polymer. The number average molecular weight of the water-soluble conductive polymer is within the range of 3000 to 100000 and, preferably, 3500 to 50000.

The quantitative ratios of the above-mentioned materials are also largely varied in accordance with the layer arrangements.

In the masking materials of the invention, the center line average roughness of the surface of the ink layer or the surface of a substrate opposite to the ink layer, is desirably within the range of 0.1 to 2.0 μm. This specified range can enhance the operability of the vacuum contact step in the course of a plate-making process. The above-mentioned surface roughness can be achieved by adding a matting agent, for example. Such a matting agent can be added into a substrate serving as a mask for plate-making, an ink layer, and a layer coated on the surface opposite to the ink layer. The particle size of the matting agent is desirably within the range of 0.2 to 6.0 μm.

The matting agents include, for example, the fine particles of silica, glass powder, the carbonates of an alkaline earth metal, cadmium or zinc, a starch derivative, polyvinyl alcohol, polystyrene, an acryl resin, acrylonitrile, and a polycarbonate resin.

In the masking materials of the invention and on the front surface of the ink layer or the surface of the substrate opposite to the ink layer, the surface resistibility of either one or both of the surfaces thereof is desirable to be not more than $10^{12}\Omega$ under the atmospheric conditions of 25° C. and 25% RH.

The means for lowering the surface resistibility include, for example, a means in which a conductive material such as a conductive metal, a metal oxide or a conductive macromolecular compound is added. The conductive metals and the metal oxides may be formed into a layer in a vacuum evaporation process or may be added in the form of the fine particles thereof. The conductive macromolecular compounds may also be coated on an ink layer or a rear surface layer upon dissolving, dispersing or emulsifying them in a solvent.

The conductive metals and the metal oxides include, for example, Al, Cu, Zn, Sn, In, Ti, ZnO, $TiO_2$, $SnO_2$, and MgO.

The conductive metals and the metal oxides shall not be limited to the above-given examples, but they also include any ones, provided, they can display the fundamental conductivity, even if they should contain an alloy comprising two or more kinds of metals or a small amount of metals.

The conductive macromolecular compounds desirably used include, for example, a polyvinyl benzensulfonic acid salt, an ammnium polyvinyl benzyltrimethyl chloride, the auqaternary polymer salts described in U.S. Pat. Nos. 4,108,802, 4,118,231, 4,126,467 and 4,137,217, and the polymer latexes described in U.S. Pat. No. 4,070,189 and Japanese Patent O.P.I. Publication Nos. 61-296352/1986 and 61 62033/1986. Besides the above, the activators described in Japanese Patent O.P.I. Publication No. 2-110447/1990, p. 394 may also be used in combination. Further besides the above, it is also effective to add carbon black so as to obtain a conductivity.

The materials capable of providing a high conductivity can preferably serve as carbon black. They include, for example, furnace black, acetylene black and lamp black.

When making use of the masking material of the invention, a masked image applicable to a plate-making mask can be formed automatically and readily without carrying out any conventional slitting and slit removing steps.

The masking material of the invention can serve as a mask having a UV shielding property and, at the same rime, it has a visibility. When the plate-making masking material has such a density as mentioned above, the rays of light utilized in a plate-making process can be cut off effectively and an image registered underneath a plate-making mask can be observed when the mask and the image are brought into contact with each other, so that the plate-making process can efficiently be performed.

The plate-making mask of the invention is excellent in both sliding and contacting properties and is also easy in manipulations such as setting, so that the operability of the vacuum contacting step can be improved in the course of performing a plate-making process.

Further, in the course of performing a plate-making process, masking material can hardly be charged, so that pinholes can hardly be produced on a prepared film by adhering dusts thereto.

EXAMPLES

Now, an example of the invention will be detailed with reference to the drawings attached hereto.

Figure 1B:
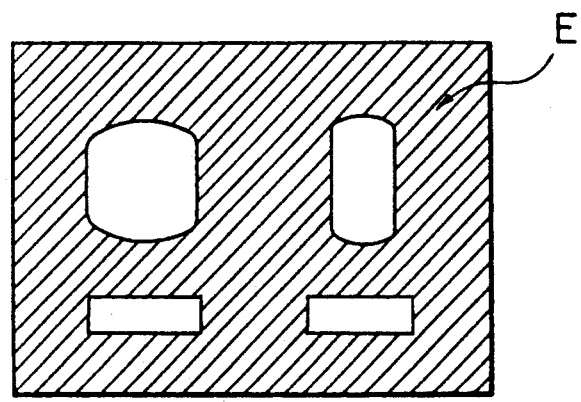
Figure 1C:
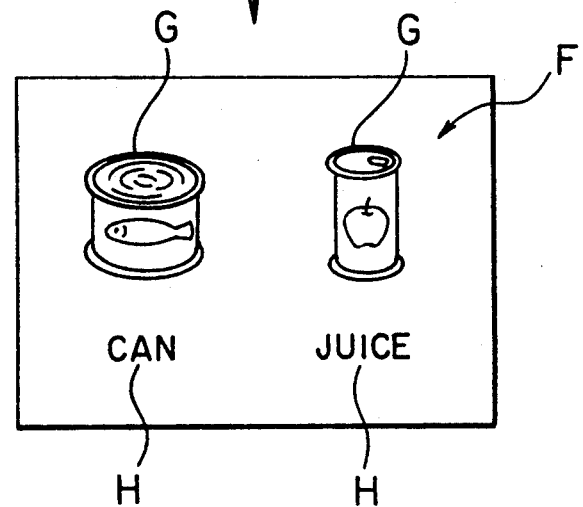

FIGS. 1(a) through 1(c) are each the drawings illustrating an example of the processes for preparing the above-described plate-making mask and an example of the application of the plate-making mask, respectively.

For putting catalogues, pamphlets or circulars into print, for example, the so-called combination montage techniques are used for making the montages of pictures themselves, pictures and letters, or pictures and marks.

As shown in FIG. 1(a), for example, in the abovementioned combination montage technique, positive original photograph B and positive letter original C are arranged and pasted up upon transparent base A, and positive original D is then prepared.

From the resulting positive original D, plate-making mask E is prepared as shown in FIG. 1(b) in the process of the invention for preparing a plate-making mask.

Then, plate-making mask E shown in FIG. 1(b) is superposed upon positive original D shown in FIG. 1(a) and they are photographed, so that negative original F shown in FIG. 1(c) can be prepared. On positive original F, negative image G and negative letter H are formed, and each of the frames for pasting positive photographic original B and positive letter original C both pasted on positive original D shown in FIG. 1(a) is removed from negative original F.

After printing the resulting negative original F, a plate is prepared and printed, so that the objective pamphlets or circulars can be printed out.

Figure 2:
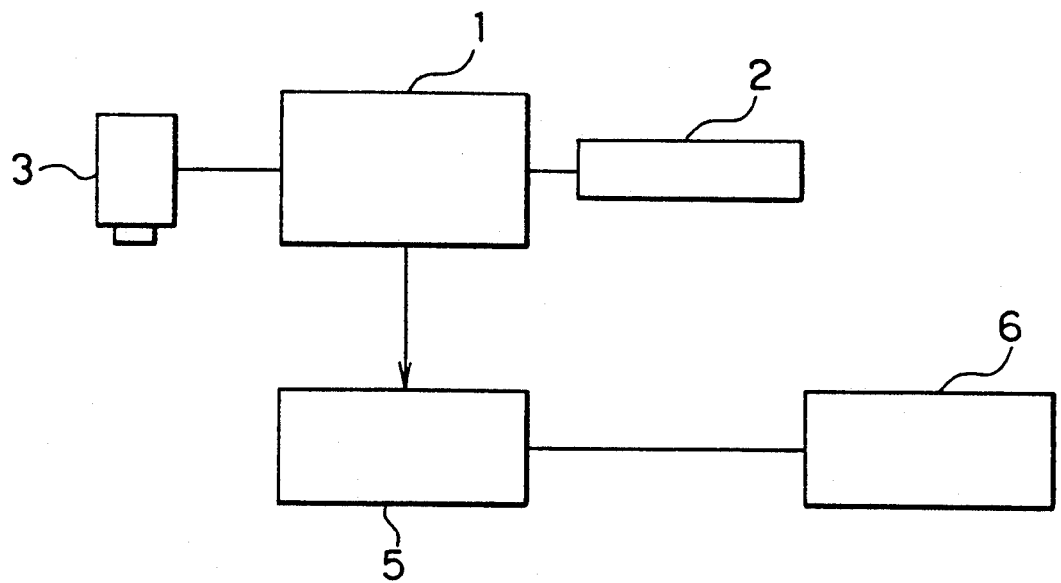
FIG. 2 shows a block illustration of an example of the preparations of the masks for plate-making of the invention.

FIG. 2 is a block diagram illustrating an example of preparing the plate-making masks of the invention.

In the diagram, image memory 2 and image input section 3 are connected to image processing section 1. Image processing section 1 and image memory 2 are each comprised of a computer and image input section 3 is comprised of, for example, a digitizer, a scanner, or a video camera. Thereby an original image is read, and the masked portions are discriminated by image processing section 1. Image memory 2 is allowed to memorize in advance a mask-added image which is to be added to an image to be input from image input section 3.

In image processing section 1, an edited masked image information is converted into the corresponding digital signals and the digital signals are output to thermal transfer system 6, by controlling print controller 5, so that a plate-making mask can be prepared.

Figure 3:
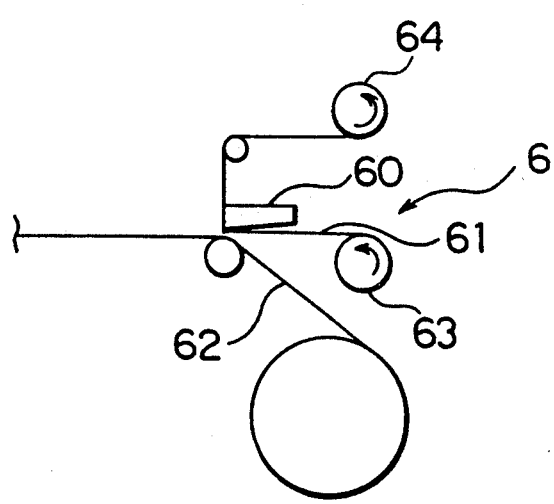
FIG. 3 shows a schematic illustration of a thermal transfer system.

FIG. 3 is a schematic illustration of a thermal transfer system.

In the illustration, thermal transfer system 6 is comprised of, for example, thermal transfer head 60, thermal transfer ribbon 61 constituting an ink layer transfer material, and transparent image recipient 62 constituting an ink layer recipient material. Thermal transfer ribbon 61 is thermally transferred to transparent image recipient 62 by thermal transfer head 60, so that a masked image can be formed on transparent image recipient 62. A plate-making mask is formed of transparent image recipient 62 having the masked image thereon. Thermal transfer ribbon 61 is then transported from ribbon supply section 63 to ribbon take-up section 64.

In preparing the plate-making mask, it is desired to coincide the position of a character or pattern in a block-copy portion with the position of the plate-making mask prepared. It is, therefore, preferred to fix a thermal-transfer head, as shown in FIG. 3.

The supports for thermal transfer ink ribbon 61 are desirably made of a thin layer base having a thickness of not thicker than 20 microns. When utilizing one side of the thermal transfer ribbon as a plate-making mask, it is desirable to sandwich the thermal transfer ribbon 61 between transparent, flat and tabular materials such as glass plates.

FIGS. 4 through 7 show each the examples of preparing plate-making masks.

In the examples shown in FIGS. 4(a) and 4(b), thermal transfer ink ribbon 70 is comprised of transparent support 70a laminated thereon with ink layer 70b. Ink layer 70b of thermal transfer ink ribbon 70 is brought into contact with image recipient 71 and a masked image is heated from the side of transparent support 70a. Thereby, a part of ink layer 70b is transferred from transparent support 70a to image recipient 71 and a masked image is formed on thermal transfer ink ribbon 70, so that thermal transfer ink ribbon 70 can be served as the masked image.

In the examples shown in FIGS. 5(a) and 5(b), thermal transfer ink ribbon 72 is comprised of support 72a laminated thereon with ink layer 72b and ink layer 72b of thermal transfer ink ribbon 72 is brought into contact with transparent support 73. When the negative image of a masked image is heated from the side of support 72a, ink layer 72b registered thereon with the negative image is transferred onto transparent image recipient 73. Thus, the masked image is formed on transparent support 73 and the resulting transparent image recipient 73 can be served as a plate-making mask.

The examples shown in FIGS. 6(a) and 6(b) are similar to the examples shown in FIGS. 4(a) and 4(b), except that a masked image is heated from the side of image recipient 71 and a part of ink layer 70b laminated on transparent support 70 is transferred onto image recipient 71. Thereby, the masked image is formed on thermal transfer ink ribbon 70 and the resulting thermal transfer ink ribbon 70 can be served as a plate-making mask.

In the examples shown in FIGS. 7(a) and 7(b), thermal transfer ink ribbon is comprised of transparent support 74a laminated thereon with ink layer 74b and further laminated on the ink layer 74 with pealable support layer 74c. A masked image is heated from the side of pealable support layer 74c and, when pealable support layer 74c is pealed off, a part of ink layer 74b is transferred from transparent support 74a to pealable support layer 74c. Thereby, the masked image is formed on transparent support 74a, so that transparent support 74a can be served as a plate-making mask.

In the examples shown in FIGS. 4 through 7, ink layers 70b, 72b and 74b are each required to be light-untransmittable and the minimum transmission densities thereof are to be not lower than at least 2.

The means for heating masked images applicable thereto include, for example, a variety of means such as a laser beam, a thermal head and a hot-press. Among them, a thermal head may preferably be used from the viewpoint of simple application. It is further preferable that the ink layer of plate-making mask has a transparent protective layer on the uppermost layer so that the plate-making masks cannot be scratched.

Further in the examples shown in FIGS. 4(a) and 4(b), thermal transfer ink ribbon 70 is used as a plate-making mask, so that a sharp and clear masked image can be formed easily.

In the examples shown in FIGS. 5 through 7, in contrast to the above, a masked image is formed on the other side of the side where the corresponding image is heated and the resulting masked image is used as a plate-making mask.

Figure 8:
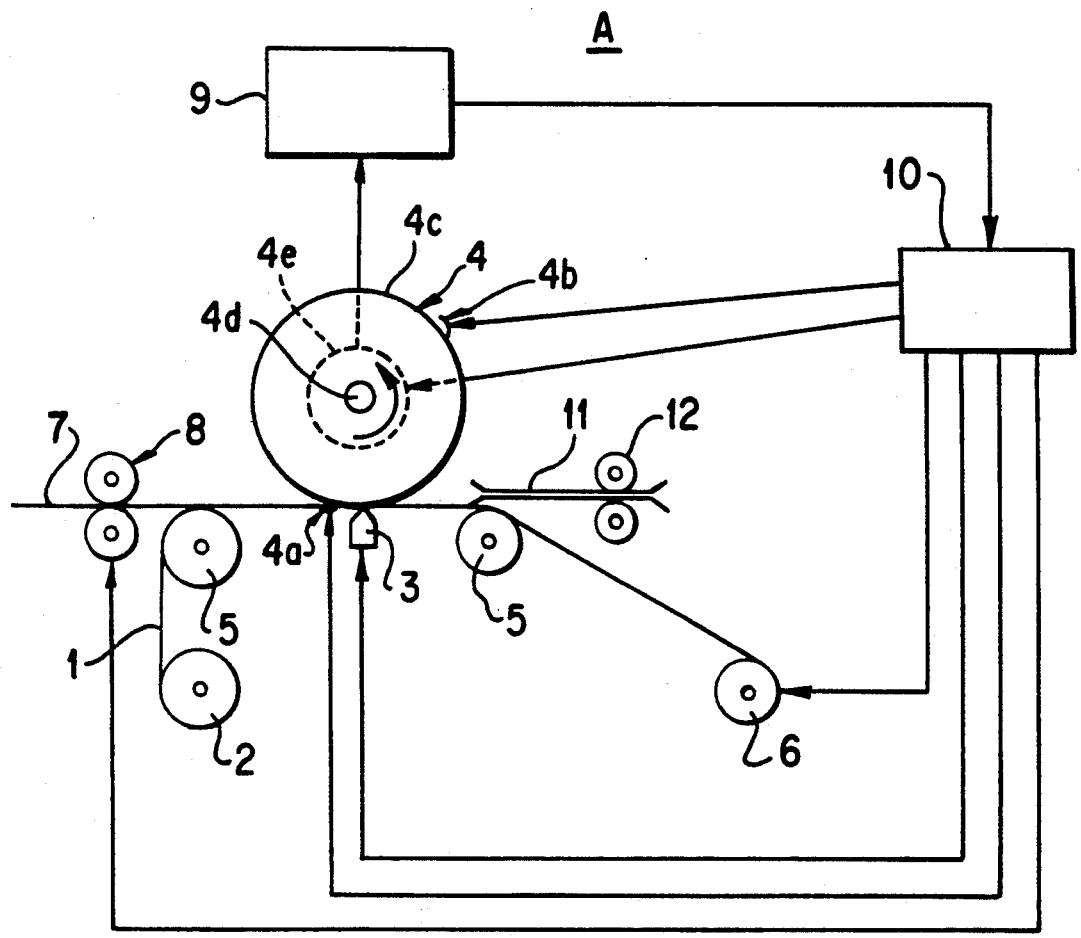
FIG. 8 is a schematic illustration of a thermal transfer system for preparing an image forming mask.
Figure 9A:
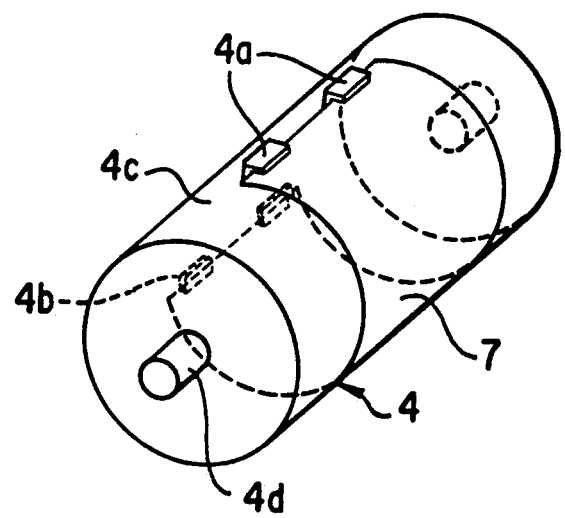
FIGS. 9 (a) and (b) are schematic illustration of the structure of an image transfer drum for winding an image receiving sheet round it.
Figure 10:
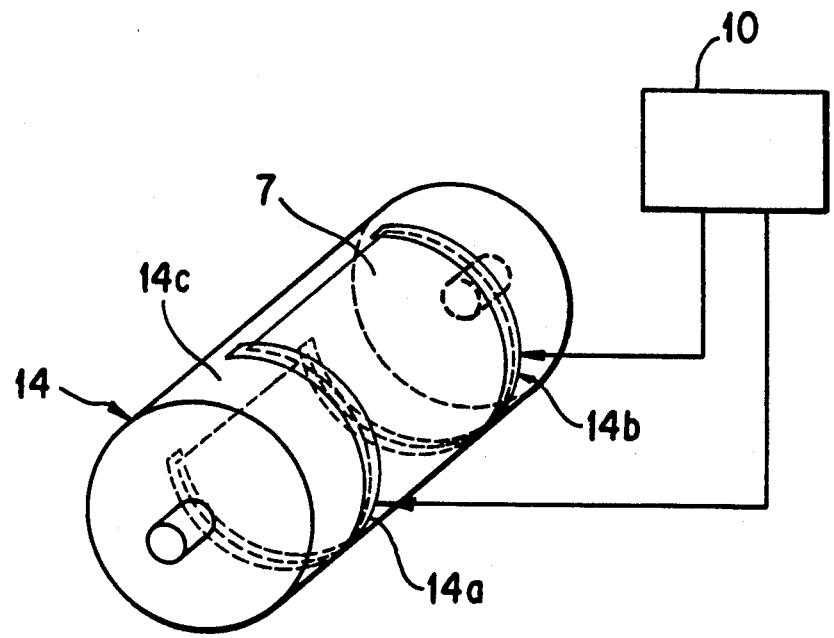
FIG. 10 is a schematic illustration of a image transfer drum having another winding means.
Figure 11:
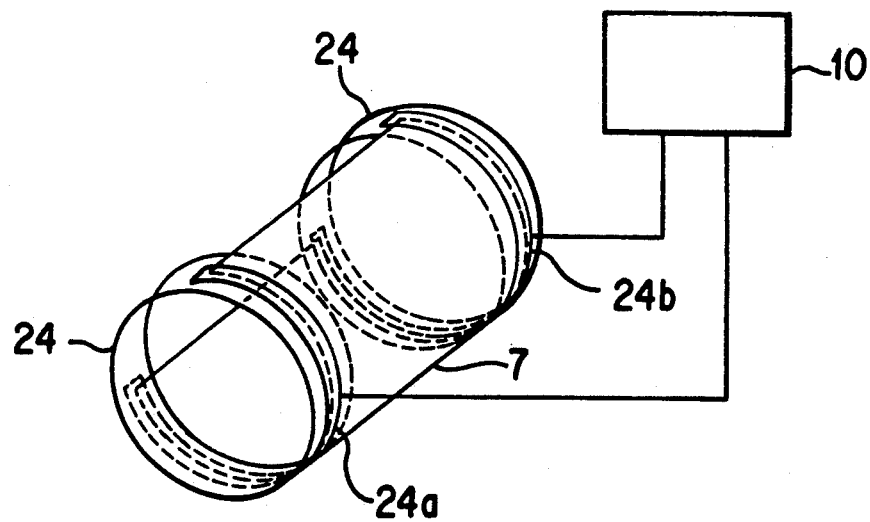
FIG. 11 is a schematic illustration of a retaining member comprising a pair of cylindrical members to which the both ends of an image receiving sheet are wound round.
Figure 12:
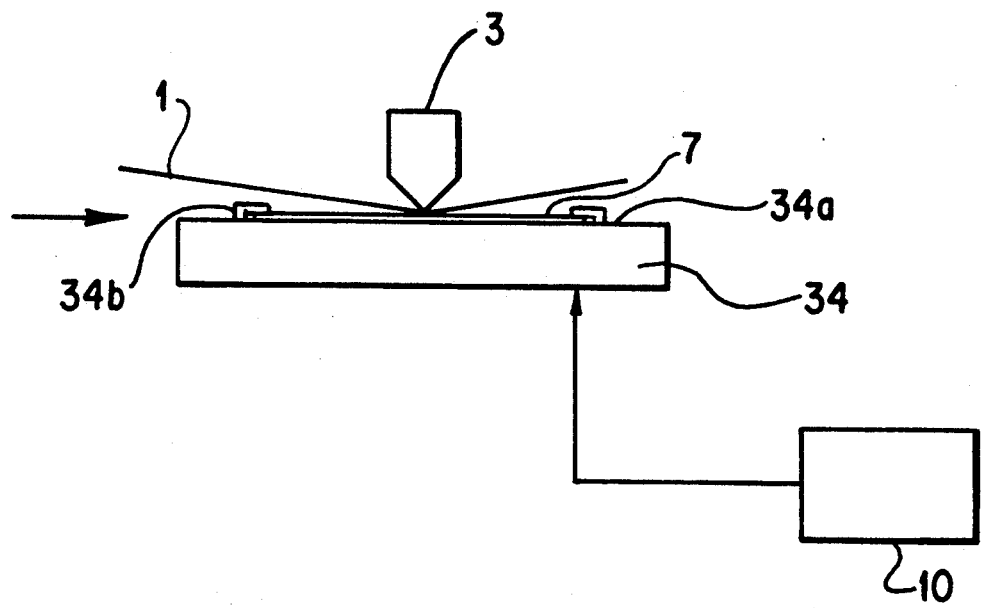
FIG. 12 is a schematic illustration of a retaining means comprising a tabular-shaped member onto which an image receiving sheet is placed.

FIG. 8 is a schematic illustration of a thermal transfer system for preparing an image forming mask; FIG. 9 is a schematic illustration of the structure of an image transfer drum for winding an image receiving sheet round it; FIG. 10 is a schematic illustration of an image transfer drum having another winding means; FIG. 11 is a schematic illustration of a retaining member comprising a pair of cylindrical members to which the both ends of an image receiving sheet are wound round; and FIG. 12 is a schematic illustration of a retaining means comprising a tabular-shaped member onto which an image receiving sheet is placed.

Now, the description will be made on a printing mechanism in which a fixed thermal head mechanism is used and printed characters can be positioned accurately.

In FIG. 8, thermal transfer system A has stock roll magazine 2 for winding fresh thermal transfer sheet 1 remaining unused, guide roller 5 and take-up roller 6 for guiding and transporting thermal transfer sheet 1 through the gap between thermal head 3 constituting a thermal printing means and image transfer drum 4 constituting a retaining means, and roller 8 for transporting image receiving sheet 7 constituting an image receiving member to the gap between thermal transfer sheet 1 being transported and image transfer drum 4.

The outer circumference of image transfer drum 4 is provided with a leading-edge retaining means 4a for catching the leading edge of image receiving sheet 7 being transported by transport roller 8 and a tail-end retaining means 4b for catching the tail-end of image receiving sheet 7. As shown in FIGS. 8 and 9(a), the leading edge retaining means 4a and the tail-end retaining means 4b are arranged in parallel with each other with specific intervals in the direction of the shift of the drum, which is perpendicularly intersecting to the circumferential direction of the barrel 4c of image transfer drum 4.

Rotating shaft 4d of image transfer drum 4 is coupled to drive motor 4e and rotation angle detecting means 9 such as a rotary encorder. The rotation angles of image transfer drum 4 is transmitted to control means 10 through rotation angle detecting means 9. This control means 10 is also connected to transport roller 8, take-up roller 6, leading edge retaining means 4a, tail-end retaining means 4b and drive motor 4e each of transfer drum 4 and thermal head 3. The control means 10 can control the operations of each means so that image receiving sheet 7 can be transported and a thermal printing can be carried out.

Next, the operations of the above-mentioned thermal transfer system A will be described below. When image receiving sheet 7 is transported by transport roller 8, the leading edge portion of the image receiving sheet 7 is retained by the leading edge retaining means 4a of image transfer drum 4 and is then wound round the circumference of the image transfer drum 4 with the rotation of the drum 4. In this instance, the tail-end portion of image receiving sheet 7 is retained by the tail-end retaining means 4b of the drum 4. Therefore, the image receiving sheet 7 is brought into close contact with the outer circumference of the drum 4 so as to be retained. After that, the image receiving sheet 7 is transported again to thermal head section 3 with the rotation of the drum 4. At this instance, the drum 4 may be rotated in either regular or reversal direction.

Figure 9B:
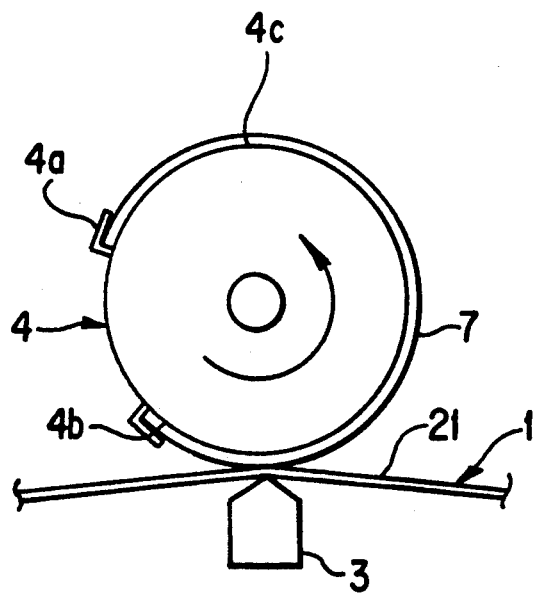

When the rotation angle detection means 9 and the control means 10 detect that the image receiving sheet 7 is positioned in thermal head section 3 as prescribed, the rotation of the image transfer drum 4 is controlled to be in the regular direction and image receiving sheet 7 and thermal transfer sheet 1 are superposed one on top of the other, so that specific characters or marks are heatedly printed from the reverse side of thermal transfer sheet 1 according to the printing signals transmitted from control means 10 by thermal head 3. [See FIG. 9(b)] Thermal transfer layer 21 which is the light-non-transmittable layer of thermal transfer sheet 1 is transferred onto image receiving sheet 7 by the abovementioned printing operation.

The above descriptions correspond to the case where image receiving sheet 7 is retained by image transfer drum 4 and leading edge retaining means 4a and tail end retaining means 4b each attached to the drum 4. The retaining means shall not be limited thereto. The constructions of the other retaining means will be detailed with reference to FIGS. 10 through 13 attached hereto.

In FIG. 10, a pair of the both side retaining means 14a and 14b is arranged in parallel with specific intervals to the direction of the circumference of the barrel section 14c so as to catch the both sides in the direction of transporting image receiving sheet 7. The pair of both side retaining means 14a and 14b can also retain the image receiving sheet 7 and release the retaining thereof according to the controls made by control means 10.

In FIG. 11, image receiving sheet 7 is retained by a pair of both side retaining means 24a and 24b attached to the direction of the circumferences of a pair of cylindrical members 24 and 24.

In FIG. 12, image receiving sheet 7 is retained by leading edge retaining means 34a and tail-end retaining means 34b each attached to tabular-shaped member 34. In this instance, thermal transfer sheet 1 and thermal head 3 are arranged onto image receiving sheet 7. It is also allowed that the whole surface of image receiving sheet 7 may be retained by bringing it into close contact by making use of a suction device or an electrostatic adsorption device attached inside tabular-shaped member 34, without making use of any leading edge retaining mens or the like.

The above-described respective retaining means can be moved under the control of control means 10, so that the printed position can be made coincide accurately again with the position of thermal head section 3.

Figure 13:
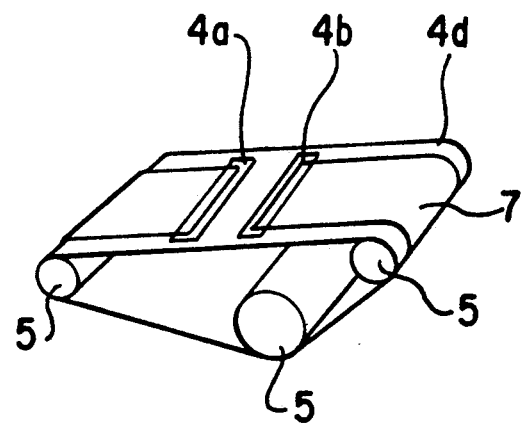
FIG. 13 shows an example of the cases where the drum 4 shown in FIG. 9 was so formed as to be a belt.

FIG. 13 shows an example of the cases where the drum 4 shown in FIG. 9 was so formed as to be a belt.

By making use of the above-described printing mechanisms, the mask accurately positioned can be printed.

Now, the typical examples of the processes for preparing the plate-making masks of the invention will be detailed below.

In the examples described below, the term, 'parts', means 'parts by weight'.

EXAMPLE 1

The solution having the following compositions was coated on a 6 μm-thick polyester base subjected to a heat resisting treatment on the back surface thereof, so that a pealable layer was formed on the base. The pealable layer was set to have a thickness of 0.5 μm.

| Compositions of the pleable layer | |
|---|---|
| A carnauba wax/water dispersion (in a 30% solution) | 95 parts |
| Adcoat AD-37P295 (in a 40% solution) [an ethylene vinyl acetate resin emulsion, manufactured by Toyo Morton Co.] | 5 parts |

The solution having the following compositions was dispersed by making use of a ball-mill, so that a pigment dispersion could be obtained.

| Ink (1) | |
|---|---|
| Acrylic resin | 5 parts |
| Pigment, Yellow 1705 [manufactured by Sanyo Dye Co.] | 20 parts |

-continued

| Ink (1) | |
|---|---|
| Water | 75 parts |

Further, the following compositions were compounded and the resulting compound was coated on a pealable layer by making use of a bar-coater, so that a 2.0 μm-thick ink layer could be prepared.

| Ink (2) | |
|---|---|
| Ink (1) (in a 25% solution) | 50 parts |
| Plus-coat Z-446 (in a 25% solution) [a water-soluble polyester resin, manufactured by Gooh Chemical Ind. Co.] | 25 parts |
| Hariester DS-70E (in a 50% solution) [rosin ester, manufactured by Jarima Chemical Ind. Co.] | 12.5 parts |

An ink ribbon was prepared in the above-described manner and the transmission density thereof was 3.1 and 1.2 in terms of 500 nm and 650 nm, respectively.

On the other hand, the sheet having the following constitution was prepared for serving as an image recipient sheet.

An image recipient sheet was prepared by coating the coating solution having the following compositions on a 100 μm-thick transparent polyester base by making use of a bar-coater so as to be a 5 μm-thick image recipient layer.

| Compositions of the image recipient layer | |
|---|---|
| Biron 200 (a polyester resin, manufactured by Toyobo Corp.) | 10 parts |
| Toluene | 90 parts |

The resulting ink ribbon and the image recipient sheet were loaded on a thermofusing transfer type line printer, Color Script 100 manufactured by QMS, Inc., and the pattern corresponding to a mask pattern made out by a computer was output imagewise. In such a manner as described above, ink was thermally transferred from the ink ribbon to the image recipient sheet, so that the resulting image recipient sheet was served as a plate-making mask.

When the resulting mask was put to the practical plate-making process, the mask could be set while observing the original and, at the same time, no fog was produced even when a printing was tried by making use of a UV lamp, so that the excellent results could be enjoyed.

EXAMPLE 2

A plate-making mask was prepared in the same manner as in Example 1, except the following image recipient layer were used.

| Compositions of the image recipient layer | |
|---|---|
| Silica (having an average particle size of 3.5 μm and including the silica particles having a particle size of not smaller than 6 μm in a proportion of not higher than 7% of the whole silica) | 50 parts |
| Saponin | 3 parts |
| Vylonal 1330 manufactured by Toyobo Corp. | 100 parts |
| Water | 847 parts |

The above given solution was dispersed by making use of a bar-coater and coated, so that a 4.0 μm-thick image recipient layer could be obtained. On the resulting image recipient layer, ink layer was thermally transferred in the same manner as in Example 1. When the surface roughness of the ink layer was measured by making use of a Perthometor made in West Germany, it was 0.71.

When the resulting mask was tried to put to the practical plate-making process, the mask could be set while observing the original and the vacuum contact step could readily be performed and, at the same time, no fog was produced even when a printing was tried by making use of a UV lamp, so that the excellent results could be enjoyed.

EXAMPLE 3

A plate-making mask was prepared in the same manner as in Example 1, except that an image recipient sheet treated in the following back-coating were used.

| Compositions of the back-coating solution | |
|---|---|
| Silica (having an average particle size of 2.4 μm and including the silica particles having a particle size of not smaller than 6 μm in a proportion of not higher than 6% of the whole silica) | 50 parts |
| Nitrocellulose | 50 parts |
| Eriedel UE 3300, (a polyester resin, manufactured by Unitika Corp.) | 100 parts |
| Toluene | 300 parts |

The coating solution having the above given compositions was coated in a dried layer thickness of 3 μm on a 200 μm-thick polyester base and, further, the same image recipient layer as in Example 1 was formed on the opposite side, so that a mask could be prepared in the same manner as in Example 1.

When the resulting mask was tried to put to the practical plate-making process, the mask could be set while observing the original and the vacuum contact step could readily be performed and, at the same time, no fog was produced even when a printing was tried by making use of a UV lamp, so that the excellent results could be enjoyed.

EXAMPLE 4

A plate-making mask was prepared in the same manner as in Example 1, except that the ink ribbon prepared in the same manner as in Example 1 and an image recipient sheet treated in the following back-coating were used.

| Compositions of the back-coating solution | |
|---|---|
| Sodium polyvinyl benzenesulfonate | 50 parts |
| Vylonal 1330, manufactured by Toyobo Corp. | 50 parts |
| Water | 100 parts |

The coating solution having the above-given compositions was coated in a dried layer thickness of 0.5 μm on a 150 μm-thick polyester base and, further, the same image recipient layer as in Example 1 was formed on the opposite side, so that a mask could be prepared in the same manner as in Example 1.

The surface resistibility of the back side of the resulting image recipient sheet was measured, after storing for 24 hours, by making use of an electrometer Model TR-8651 manufactured by Takeda Riken Labs, Inc. (with the stainless steel-made electrodes having the intervals of 1.4 mm, the lengths of 10 cm) and under the atmospheric conditions of 25° C. and 25% RH. The resulting surface resistibility was $10^{11}\Omega$.

When the resulting plate-making mask was tried to put to the practical plate-making process, the mask could be set while observing the original and a dust adhesion could be found very few because the electrification was very few in the courses of operations and, at the same time, no fog was produced even when a printing was tried by making use of a UV lamp, so that the excellent results could be enjoyed.

COMPARATIVE EXAMPLE

When preparing a mask similar to those given in Examples 1 through 4 with a conventional slitting type plate-making process, it takes 3 times longer in average and, in addition, there may be some instances where the efficiency in a vacuum contact step may be lowered and dusts may adhere to the mask, so that the mask efficiency and the quality of the final products may be seriously deteriorated as compared to the plate-making masks of the invention.

What is claimed is:

1. A mask for plate-making prepared by
   contacting an ink receiving material with an ink layer transfer material having an ink layer on a substrate,
   applying heat in a mask pattern to the contacted material, and
   transferring the ink layer to the ink-layer-receiving material, wherein the transmission density of the ink layer is not lower than 2 for light having a wavelength not longer than 500 nm and not higher than 2 for at least a part of light having a wavelength longer than 500 nm.

2. The mask according to claim 1, wherein the center line average roughness of the surface of said ink layer of the mask is within the range of 0.1 to 2.0 μm.

3. The mask according to claim 1, wherein the center line average roughness of the surface of the substrate not facing said ink layer of the mask is within the range of 0.1 to 2.0 μm.

4. The mask according to claim 1, wherein the surface resistability of the surface of said ink layer of the mask is not higher than $10^{12}\Omega$ at 25° C. and 25% relative humidity.

5. The mask according to claim 1, wherein the surface resistability of the surface of the substrate not facing said ink layer of the mask is not higher than $10^{12}\Omega$ at 25° C. and 25% relative humidity.

6. The mask according to claim 1, wherein the surface resistibility of both the surface of said ink layer of the mask and the surface of the substrate not facing said ink layer of the mask are not higher than $10^{12}\Omega$ at 25° C. and 25% relative humidity.

* * * * *

UNITED STATES PATENT AND TRADEMARK OFFICE
CERTIFICATE OF CORRECTION

PATENT NO. : 5,185,186

DATED : February 9, 1993

INVENTOR(S) : Kawakami et al.

It is certified that error appears in the above-identified patent and that said Letters Patent is hereby corrected as shown below:

Claim 4, column 14, line 17, change "resistability" to -- resistibility--;

column 14, line 18, change "$10^{12} \Omega$ at 25° C." to --$10^{12} \Omega$ at 25°C--

Claim 5, column 14, line 21, change "resistability" to --resistibility--;

column 14, line 22, change "$10^{12} \Omega$ at 25°C." to --$10^{12} \Omega$ at 25°C--; and Claim 6, column 14, line 27, change "$10^{12} \Omega$ at 25° C." to --$10^{12} \Omega$ at 25°C--.

Signed and Sealed this

Fourth Day of January, 1994

*Attest:*

BRUCE LEHMAN

*Attesting Officer*   *Commissioner of Patents and Trademarks*